United States Patent
Hauenschild et al.

(10) Patent No.: US 12,170,525 B2
(45) Date of Patent: Dec. 17, 2024

(54) POWER EFFICIENT TRANSFORMER-BASED INTERFACE CIRCUIT TO INTERFACE A DIFFERENTIAL CURRENT SINKING DAC TO LASER ANODE

(71) Applicant: Cisco Technology, Inc., San Jose, CA (US)

(72) Inventors: Juergen Hauenschild, Bochum (DE); Sachidanandam Sundarraju, Nuremberg (DE); Jan Louis Sundermeyer, Nuremberg (DE)

(73) Assignee: CISCO TECHNOLOGY, INC., San Jose, CA (US)

( * ) Notice: Subject to any disclaimer, the term of this patent is extended or adjusted under 35 U.S.C. 154(b) by 209 days.

(21) Appl. No.: 17/993,163

(22) Filed: Nov. 23, 2022

(65) Prior Publication Data
US 2024/0171194 A1 May 23, 2024

(51) Int. Cl.
| *H03M 1/66* | (2006.01) |
| *H01S 5/183* | (2006.01) |
| *H01S 5/50* | (2006.01) |

(52) U.S. Cl.
CPC .............. *H03M 1/66* (2013.01); *H01S 5/183* (2013.01); *H01S 5/5027* (2013.01)

(58) Field of Classification Search
CPC ........... H03M 1/66; H01S 5/5027; G05F 3/02
USPC ...................................................... 341/144
See application file for complete search history.

(56) References Cited

U.S. PATENT DOCUMENTS

| 5,347,389 | A | 9/1994 | Skrobko |
| 5,477,370 | A | 12/1995 | Little et al. |
| 7,630,422 | B1 | 12/2009 | Ziazadeh et al. |
| 7,821,339 | B1* | 10/2010 | Afsahi ..................... H03F 3/72 330/261 |
| 2019/0007141 | A1 | 1/2019 | Kawata |
| 2020/0185875 | A1 | 6/2020 | Allouche et al. |
| 2020/0195199 | A1* | 6/2020 | Cannella ............... H03F 1/0277 |
| 2020/0228081 | A1* | 7/2020 | Wu ....................... H03G 1/0088 |
| 2020/0274495 | A1* | 8/2020 | Ren ..................... H03F 3/45475 |
| 2022/0209494 | A1 | 6/2022 | Huang et al. |

* cited by examiner

*Primary Examiner* — Peguy Jean Pierre
(74) *Attorney, Agent, or Firm* — Edell, Shapiro & Finnan, LLC

(57) ABSTRACT

An interface circuit that interfaces a digital-to-analog converter (DAC) to a vertical-cavity surface emitting laser. The apparatus includes a first cascode amplifier that receives as input positive and negative differential outputs of the DAC and provides a positive amplified output and a negative amplified output, and a second cascode amplifier having a positive input and a negative input. The positive input of the second cascode amplifier being coupled to the positive amplified output of the first cascode amplifier. The second cascode amplifier is configured to generate a positive amplified current and a negative amplified current at a negative amplified output. The positive amplified current and the negative amplified current are combined and a resulting output current is provided as input to an anode of the laser. A transformer is coupled between the negative amplified output of the first cascode amplifier and the negative input of the second cascode amplifier.

20 Claims, 5 Drawing Sheets

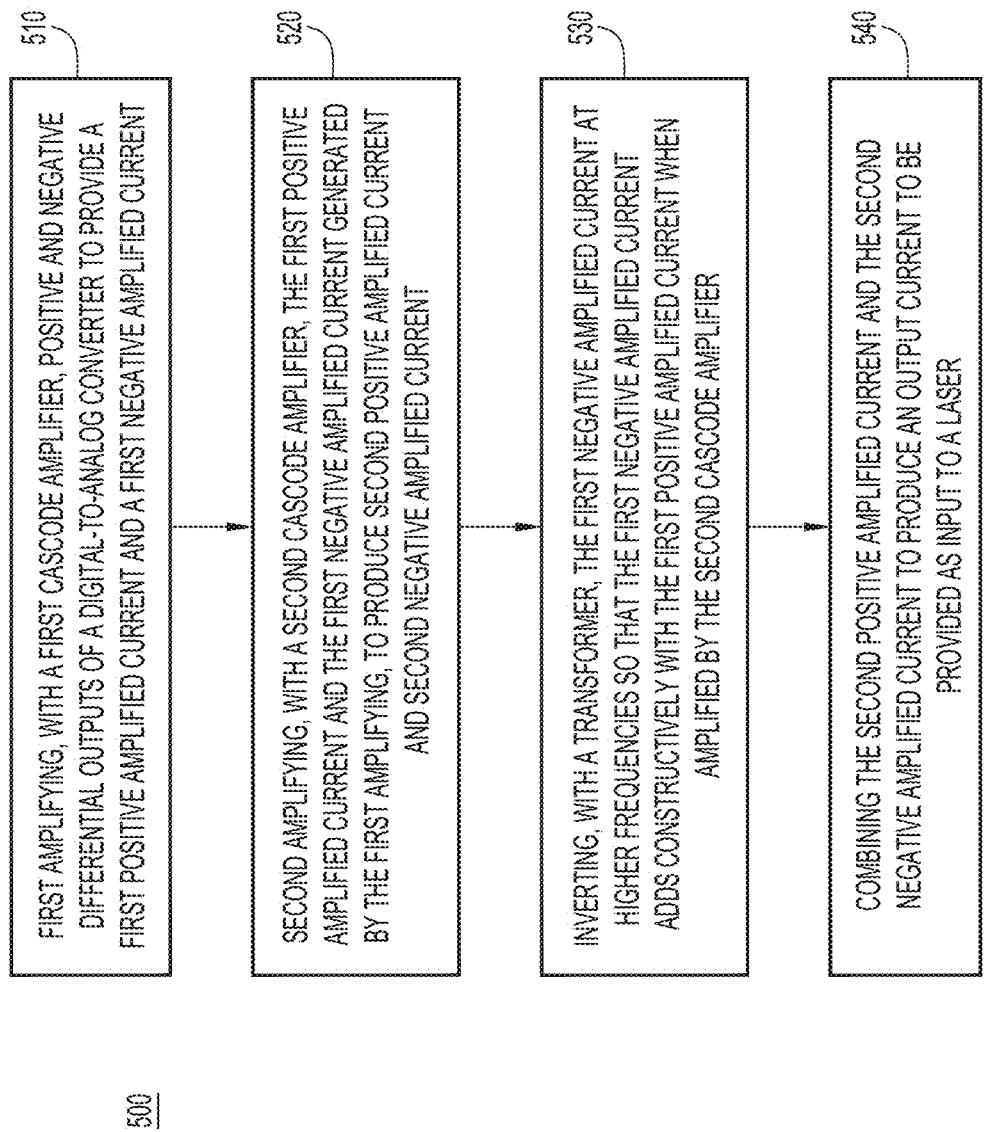

POWER EFFICIENT TRANSFORMER-BASED INTERFACE CIRCUIT TO INTERFACE A DIFFERENTIAL CURRENT SINKING DAC TO LASER ANODE

TECHNICAL FIELD

The present disclosure relates to circuitry for digital-to-analog converters (DACs).

BACKGROUND

Optical transmitter circuits with powerful predistortion/pre-emphasis usually employ a digital signal processor (DSP) followed by a digital-to-analog converter (DAC). This is the case for Pulse Amplitude Modulation 4 (PAM4) coding used for optical communication. The predistortion can be linear and/or nonlinear but usually compensates for bandwidth limitations in the electrical-to-optical conversion and/or the optical channel, and therefore has a high-pass characteristic. High speed DACs often have N-type Metal Oxide Silicon (NMOS) differential pairs (binary and unary weighted) as an output stage so that the output behaves like a differential current sink.

The common mode output signal of such a DAC can degrade the effective number of bits (ENoB) due to even order harmonics and clock feedthrough. Vertical-Cavity Surface-Emitting Lasers (VCSELs), and especially VCSEL arrays, are driven through the anode connection because the cathode has higher parasitics or is directly connected to AC ground.

BRIEF DESCRIPTION OF THE DRAWINGS

FIG. 5 is a flow chart for a method of interfacing differential outputs of a digital-to-analog converter to a single-ended input of a laser, according to an example embodiment.

DETAILED DESCRIPTION

Overview

Figure 1:
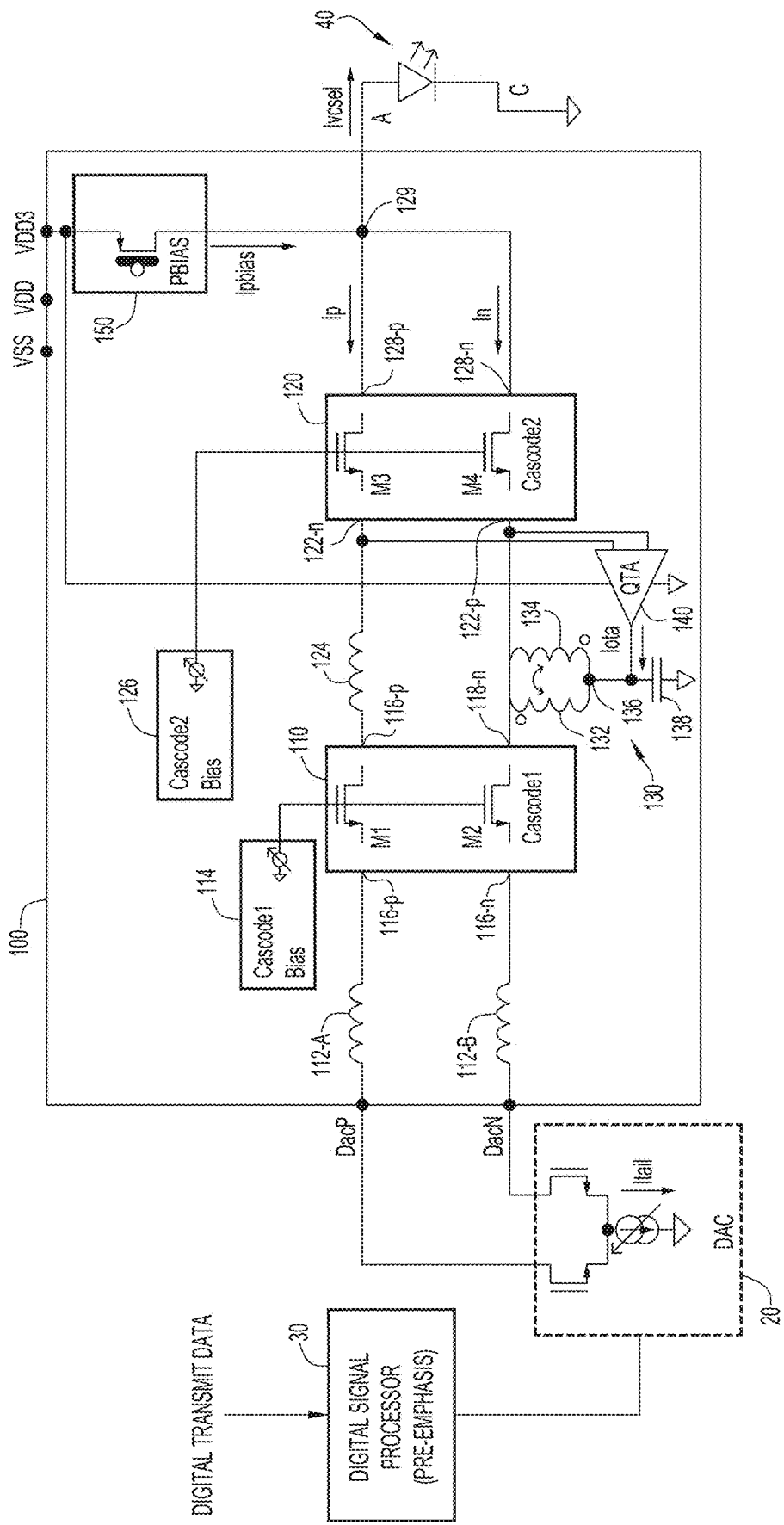
FIG. 1 is a schematic circuit diagram of an interface circuit configured to interface a differential digital-to-analog converter to a laser, according to an example embodiment.

In one embodiment, an apparatus is provided to interface a digital-to-analog converter to a laser, such as a vertical-cavity surface emitting laser (VCSEL). The apparatus includes a first cascode amplifier configured to receive as input positive and negative differential outputs of the digital-to-analog converter and to provide a positive amplified output and a negative amplified output, and a second cascode amplifier having a positive input and a negative input. The positive input of the second cascode amplifier is coupled to the positive amplified output of the first cascode amplifier. The second cascode amplifier is configured to generate a positive amplified current at a positive amplified output and to generate a negative amplified current at a negative amplified output, wherein the positive amplified output and the negative amplified output are connected together at an output node and the positive amplified current and the negative amplified current are combined to produce an output current that is provided as input to an anode of the laser. A transformer is coupled between the negative amplified output of the first cascode amplifier and the negative input of the second cascode amplifier.

Example Embodiments

A power efficient linear interface circuit is presented herein that can interface a DAC to a VCSEL while providing common mode rejection and analog pre-emphasis to assist with, or enhance, digital pre-emphasis. A VCSEL can have a low pass characteristic. Predistortion (pre-emphasis) is used to compensate for effects of the laser as well as in an optical fiber over which light is transmitted by the laser. This interface circuit is designed to support the digital predistortion performed by a digital signal processor, which is calibrated for each type of laser over temperature, etc. In addition, the interface circuit is designed to ensure that the DAC is not under-driven in certain frequency ranges. The DAC may be built on differential transistor pairs and the transistors may have a maximum voltage before breaking down. The DAC typically has differential outputs but a VCSEL cannot be driven differentially because it can be driven only through an anode connection. A differential-to-signal ended conversion is therefore used to drive the VCSEL.

As described in more detail below, an interface circuit is provided that includes a first cascode amplifier (cascode) having first and second inputs, and first and second outputs, and a second cascode amplifier having first and second inputs, and first and second outputs. The first and second inputs of the first cascode amplifier are coupled to receive positive and negative differential outputs, respectively, of a DAC. The first cascode amplifier is configured to generate a first positive amplified current at the first output and a first negative amplified current at the second output.

The first input of the first cascode amplifier is coupled to the first output of the first cascode amplifier. The second cascode amplifier is configured to generate a second positive amplified current at the first output and to generate a second negative amplified current at the second output. The first output and the second output of the second cascode amplifier are connected together at an output node where the second positive amplified current and the second negative amplified current are combined to produce an output current to be provided to an anode of the vertical-cavity surface emitting laser.

The interface circuit further includes a transformer having a primary winding that is coupled to the second output of the first cascode amplifier, a secondary winding coupled to the second input of the second cascode amplifier, and a center tap between the primary winding and the secondary winding. A capacitor is coupled between the center tap and ground.

An operational transconductance amplifier is provided having a first input coupled to the first output of the first cascode amplifier, a second input coupled to the secondary winding of the transformer, and an output coupled to the center tap of the transformer. The operational transconductance amplifier is configured to generate an output current that is based on a difference between a voltage at the first input and a voltage at the second input so as to maintain a voltage at the center tap of the transformer. Furthermore, the transformer is configured to invert, at higher frequencies, a polarity of the first negative amplified current so that it adds constructively with the first positive amplified current when amplified by the second cascode amplifier.

Reference is now made to FIG. 1, which shows a schematic circuit diagram of an interface circuit 100 that may be used to interface a differential current mode DAC 20 to a VCSEL, according to an example embodiment. The interface circuit 100 is a differential-to-single-ended conversion circuit that drives the VCSEL 30 from the differential outputs DacP and DacN of the DAC 20. The input to the DAC 20 may be provided by a digital signal processor (DSP) 30 that processes digital transmit data to perform digital pre-emphasis on the digital transmit data prior to being supplied to the DAC 20 for analog-to-digital conversion. The interface circuit 100 outputs a current, Ivcsel, that is supplied to an anode (A) of a VCSEL 40. The VCSEL 40 may be in turn coupled to an optical fiber (not shown) over which the VCSEL transmits optical signals. The cathode (C) of the VCSEL 40 may be connected to ground.

The interface circuit 100 includes a first cascode amplifier 110 (denoted Cascode1) and a second cascode amplifier 120 (denoted Cascode2). The first cascode amplifier 110 is configured to receive as input positive and negative differential outputs (DacP and DacN) of the DAC 20. The differential outputs of the DAC 20 may be coupled to the inputs of the first cascode amplifier 110 via coils (inductors) 112-A and 112-B. The coils 112-A and 112-B may compensate for the capacitance at the DAC outputs.

The first cascode amplifier 110 may be based on a "core" metal oxide silicon (MOS) transistor technology, making it higher bandwidth (faster) and more suitable to track high frequency signals, with a relatively low breakdown voltage. A "core" MOS is a thin oxide MOS (used in the core of an integrated circuit) as opposed to a thick oxide MOS often used for the input/output of an integrated circuit. The first cascode amplifier 110 comprises MOS transistors M1 and M2 biased by a first cascode bias circuit 114. The first cascode amplifier 110 has a first (positive) input 116-$p$ and a second (negative) input 116-$n$ coupled to the coils 112-A and 112-B, respectively. The first cascode amplifier 110 is configured to amplify the DAD differential outputs DacP and DacN to produce, at the first (positive) output 118-$p$ and the second (negative) output 118-$n$, a first positive amplified output current and a first negative amplified output current, respectively.

The second cascode amplifier 120 may be built with a thick oxide technology that allows for a desired radio frequency (RF) swing for the VCSEL 40, and to provide a voltage suitable for the VCSEL 40, such as approximately 2.5 volts. The second cascode amplifier 120 comprises MOS transistors M3 and M4, and has a first (positive) input 122-$p$ and a second (negative) input 122-$n$. The first input 122-$p$ is coupled to the first output 118-$p$ of the first cascode amplifier 110, via an inductor 124. The second cascode amplifier 120 is biased by a second cascode bias circuit 126 and is configured to generate a second positive amplified current (Ip) at the first (positive) output 128-$p$ and a second negative amplified current (In) at a second (negative) output 128-$n$. As described further below, the first output 128-$p$ and the second output 128-$n$ of the second cascode amplifier 120 are connected together at an output node 129, where the second positive amplified current (Ip) and the second negative amplified current (In) combine to produce a resulting output current to be provided to an anode of the VCSEL 40.

A transformer 130 is provided that is coupled between the second output 118-$n$ of the first cascode amplifier 110 and the second input 122-$n$ of the second cascode amplifier 120. More specifically, the transformer 130 has a primary winding 132 that is coupled to the second output 118-$n$ of the first cascode amplifier 110 and a secondary winding 134 that is coupled to the second input 122-$n$ of the second cascode amplifier 120. The transformer has a center tap 136 and a capacitor 138 is coupled between the center tap 136 and ground. In one example, the capacitor is a 100 pico (p) Farad capacitor. The transformer 130 is configured to invert a polarity of the first negative amplified current at the second output 118-$n$ of the first cascode amplifier 110 at higher frequencies, so that it adds constructively with the first positive amplified current (at the first output 118-$p$) of the first cascode amplifier 110, when amplified by the second cascode amplifier 120.

An operational transconductance amplifier (OTA) 140 may be provided that has first and second inputs, with the (first) positive input (+) coupled to the first output 118-$p$ of the first cascode amplifier 110, after the inductor 124, and a second (negative) input (−) coupled to the secondary winding 134 which is coupled to the second input 122-$n$ of the second cascode amplifier 120. The output of the OTA 140 is a current (Iota) coupled to a node between the center tap 136 of the transformer 130 and the capacitor 138. The OTA 140 is configured to produce the output current (Iota) based on a difference between the voltages at its inputs.

The interface circuit 100 further includes a bias circuit 150 that provides a bias current, Ipbias, to the output node 129. The bias current Ipbias divides at the output node 129 into the second positive amplified current Ip and the second negative amplified current In, as shown in FIG. 1. The current from the output node 129 is coupled to the anode of the VCSEL 40, and is denoted as Ivcsel. At DC, the VDD3 bias current Ipbias=Itail+Iota+Ivcsel, and Iota may be approximately 0.4*Itail.

In operation, the analog differential outputs DacP and DacN of the DAC 20 are coupled to the first and second inputs 116-$p$ and 116-$n$ of the first cascode amplifier 110, via coils (inductors) 112-A and 112-B. The first cascode amplifier 110 amplifies the differential outputs DacP and DacN and provides a first positive amplified current and a first negative amplified current at the first and second outputs 118-$p$ and 118-$n$, respectively. The bias circuit 150 compensates for the DC common mode current of the DAC 20 and sets a bias for the VCSEL 40.

At DC, the transformer 130 has no impact on the differential DAC output signals. The DC current of the first cascode amplifier 110 is re-used for the second cascode amplifier 120. That is, the DC current that goes through the transformer 130 can serve to bias the second cascode amplifier 120. At higher frequencies, on the other hand, the transformer 130 becomes active in the negative current path of the first cascode amplifier 110 and inverts a polarity of the first negative amplified current (an amplified version of DacN) at the second output 118-$n$ of the first cascode amplifier so that it adds constructively with the first positive amplified current (an amplified version of DacP) when coupled to the OTA 140, and when amplified by the second cascode amplifier 120. The transformer 130 thus inverts, at higher frequencies, a polarity of the first negative amplified current (at the second output 118-$n$ of the first cascode amplifier) such that the first negative amplified current adds constructively with the first positive amplified current at the first output 118-*p* of the first cascade amplifier 110 when coupled to the OTA 140, and when amplified by the second cascade amplifier 120.

Any stray inductance of the transformer 130 may serve to peak (boost) the current into the negative current path (to second input 122-*n*) of the second cascade amplifier 120, which may be useful to compensate for some of the attenuation of the second cascade amplifier 120 at higher frequencies. For symmetry, the inductance value for inductor 124 in the positive current path between first cascade amplifier 110 and second cascade amplifier 120 is chosen to be a substantially inductance as a stray inductance of the transformer 130. This results in providing common mode rejection towards the VCSEL 40 as well providing approximately 6 dB analogue pre-emphasis, avoiding use of a coil and termination resistor in the output path to the VCSEL 40, thereby simplifying the design of the interface circuit 100.

The OTA 140 and the capacitor 138 serve as a feed-forward control loop and are provided to maintain a voltage at the center tap 136 of the transformer 130 (called a center voltage) to a certain fixed voltage. This is achieved by matching a transconductance (Gm) of the OTA 140 with a transconductance of the second cascade amplifier 120. At lower frequencies and DC, the OTA 140 determines a difference between a voltage on the positive current path at first input 122-*p* (as a reference) and a voltage on the negative current path (at the second input 122-*n*), and from this difference (and based on a conversion factor of voltage to current), the OTA 140 generates an output current (Iota). At higher frequencies, when the OTA 140 becomes ineffective, the capacitor 138 takes over, keeping the center voltage at a fixed voltage. This removes low frequency changes in current through the transformer 130. Without the OTA 140, the current at the input 122-*p* of the second cascade amplifier 120 would swing opposite to the current at the input 122-*n* at low frequencies. The OTA 140 achieves the aforementioned transconductance match such that the drain current of the transistor M2 of the first cascade amplifier 110 will be compensated and therefore the voltage at the second input 122-*n* of the second cascade amplifier 120 ideally will be compensated to zero. This control architecture works with a feedback loop gain of one, and thus is predominantly a feed-forward control.

Figure 2:
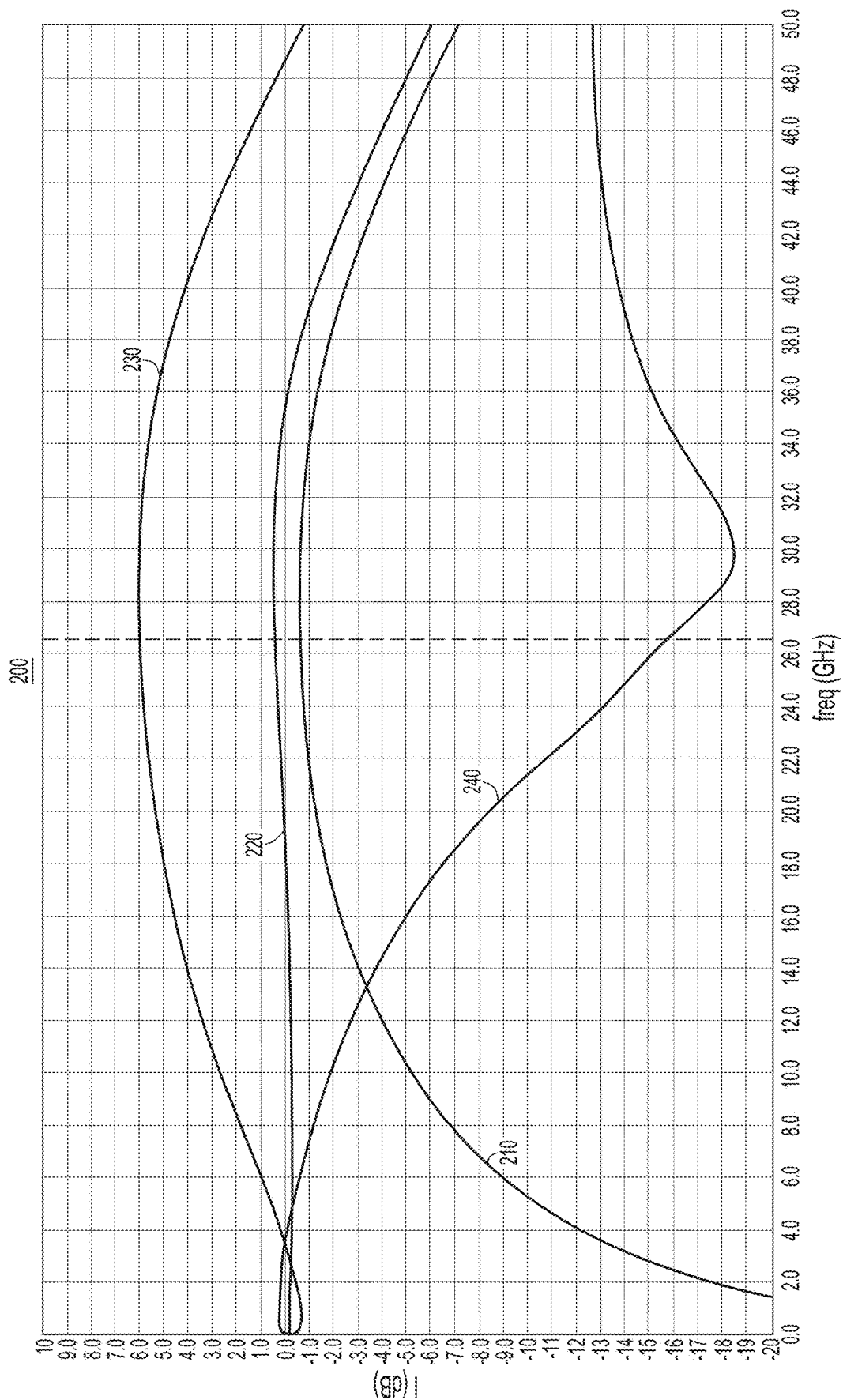
FIG. 2 illustrates plots depicting performance of the interface circuit shown in FIG. 1 based on simulations, according to an example embodiment.

Turning to FIG. 2, plots 200 are shown that are associated with simulation results of the interface circuit 100 operating with a 53 Gigabaud (GBd), PAM4 modulation scheme. Curve 210 is a plot for the negative current (In) at the second output 128-*n* of the second cascade amplifier 120 and curve 220 is a plot of the positive current (Ip) at the first output 128-*p* of the second cascade amplifier 120. Curve 210 shows that at lower frequencies (less than 16 GHz), the negative current is much lower than the positive current shown by curve 220, but at higher frequencies (18 GHz and higher), the negative current is fairly close to the positive current and they generally track each other. Curve 230 is a plot of the positive current plus the negative current (Ip+In) and it is apparent from this curve that there is a nearly 6 dB of increase (gain) in amplitude, with respect to the positive current (single-ended). Curve 240 is a plot of common mode rejection (Ip−In). As shown in FIG. 2, common mode rejection starts around 20-25 GHz and stays quite good, which helps improve DAC performance, which is often limited by high frequency common mode issues.

Figure 3:
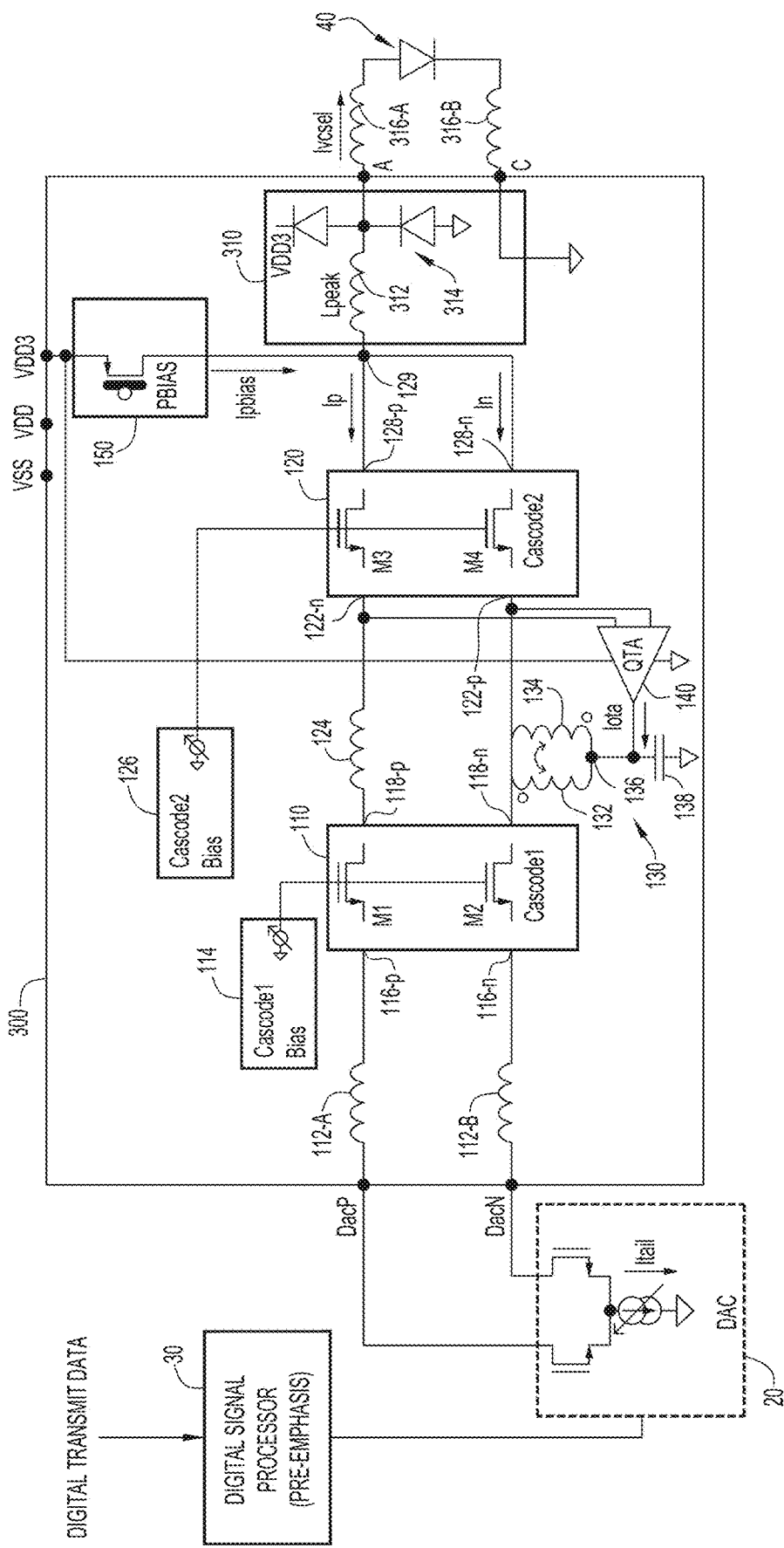
FIG. 3 a schematic circuit diagram of an interface circuit configured to interface a differential digital-to-analog converter to a laser, according to another example embodiment.

Reference is now made to FIG. 3. FIG. 3 shows an interface circuit 300 that is a variation of the interface circuit 100 of FIG. 1. Interface circuit 300 includes all of the components of the interface circuit 100, and further includes a peaking network 310. The peaking network 310 is coupled between the node 129 and the VCSEL 40. The peaking network 310 includes an inductor 312 (Lpeak) and associated bias voltage circuit 314 coupled to the anode (A) of the VCSEL 40. There are bond wires to the VCSEL 40 that may have some inductance, shown at reference numerals 316-A and 316-B. The peaking network 310 provides an inductive output peaking towards the VCSEL 40 to add further current gain (e.g., 2.4 dB gain) at half baud rate. Thus, the peaking network 310 increases the analog pre-emphasis to the VCSEL current, Ivcsel.

Figure 4:
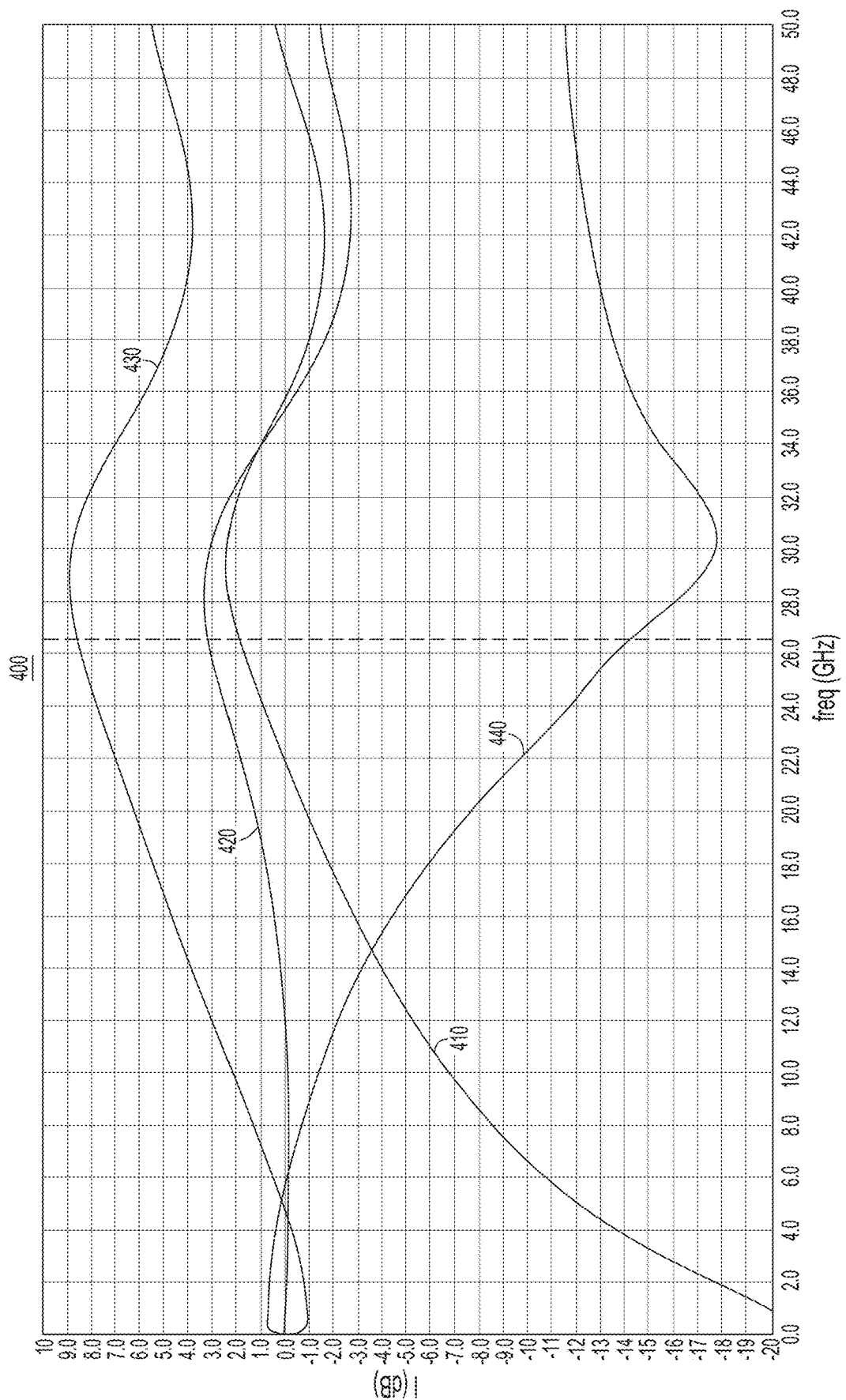
FIG. 4 illustrates plots depicting performance of the interface circuit shown in FIG. 3 based on simulations, according to an example embodiment.

Reference is now made to FIG. 4, which shows plots 400 associated with simulation results of the interface circuit 300 operating with a 53 Gigabaud (GBd), PAM4 modulation scheme. Like FIG. 2, curve 410 is a plot for the negative current (In) at the second output 128-*n* of the second cascade amplifier 120 and curve 220 is a plot of the positive current (Ip) at the first output 128-*p* of the second cascade amplifier 120. Curve 410 shows that at lower frequencies (less than 16 GHz), the negative current is much lower than the positive current shown by curve 420, but at higher frequencies (18 GHz and higher), the negative current is fairly close to the positive current and they generally track each other. Curve 430 is a plot of the positive current plus the negative current (Ip+In) and it is apparent from this curve, that there is even better increase (e.g., 8.4 dB) in amplitude, with respect to the positive current (single-ended), as compared to curve 230 shown in FIG. 2 for interface circuit 100. Curve 440 is a plot of common mode rejection (Ip−In). As shown in FIG. 4, common mode rejection is quite similar to that of the interface circuit 100 as shown by curve 240 in FIG. 2.

Reference is now made to FIG. 5. FIG. 5 illustrates a flow chart for a method 500, according to an example embodiment. The method 500 includes at step 510, first amplifying, with a first cascade amplifier, positive and negative differential outputs of a digital-to-analog converter to provide a first positive amplified current and a first negative amplified current. At step 520, the method 500 includes second amplifying, with a second cascade amplifier, the first positive amplified current and the first negative amplified current generated by the first amplifying, to produce a second positive amplified current and a second negative amplified current. At step 530, the method 500 includes inverting, with a transformer, polarity of the first negative amplified current at higher frequencies so that the first negative amplified current adds constructively with the first positive amplified current when amplified by the second cascade amplifier. At step 540, the method 500 includes combining the second positive amplified current and the second negative amplified current to produce an output current to be provided as input to a laser, e.g., to an anode of a VCSEL.

In summary, a power efficient linear interface circuit is presented herein that can interface a DAC to a VCSEL while providing common mode rejection and analog pre-emphasis to assist with, or enhance, digital pre-emphasis. The interface circuit includes a transformer having a primary winding that is coupled between a first cascade amplifier and a second cascade amplifier, and a capacitor is provided that is coupled between a center tap of the transformer and ground. The transformer is configured to invert, at higher frequencies, a polarity of a negative amplified current (output by the first cascade amplifier) so that it adds constructively with a positive amplified current (output by the first cascade amplifier) when amplified by the second cascade amplifier.

In some aspects, the techniques described herein relate to an apparatus to interface a digital-to-analog converter to a laser, including: a first cascade amplifier configured to receive as input positive and negative differential outputs of the digital-to-analog converter and to provide a positive amplified output and a negative amplified output; a second cascode amplifier having a positive input and a negative input, the positive input being coupled to the positive amplified output of the first cascode amplifier, wherein the second cascode amplifier is configured to generate a positive amplified current at a positive amplified output and to generate a negative amplified current at a negative amplified output, wherein the positive amplified output and the negative amplified output are connected together at an output node and the positive amplified current and the negative amplified current are combined to produce an output current that is provided as input to an anode of the laser; and a transformer coupled between the negative amplified output of the first cascode amplifier and the negative input of the second cascode amplifier.

In some aspects, the transformer is configured to invert polarity of current at higher frequencies in a negative current path between the first cascode amplifier and the second cascode amplifier.

In some aspects, the transformer is configured to provide DC current from the first cascode amplifier to the second cascode amplifier to assist in biasing the second cascode amplifier.

In some aspects, the transformer includes a primary winding coupled to the negative amplified output of the first cascode amplifier, a secondary winding coupled to the negative input of the second cascode amplifier, and a center tap between the primary winding and the secondary winding.

In some aspects, the techniques described herein relate to an apparatus, further including: a capacitor coupled between the center tap of the transformer and ground; and an operational transconductance amplifier having a first input coupled to the positive amplified output of the first cascode amplifier, a second input coupled to the secondary winding of the transformer, and an output coupled to the center tap of the transformer, wherein the operational transconductance amplifier is configured to generate an output current that is based on a difference between a voltage at the first input and a voltage at the second input so as to maintain a voltage at the center tap of the transformer.

In some aspects, the operational transconductance amplifier is configured to generate the output current to maintain the voltage at the center tap at lower frequencies, and the capacitor is configured to maintain the voltage at the center tap at higher frequencies.

In some aspects, the operational transconductance amplifier is configured to generate the output current to the center tap of the transformer based on a conversion factor so as to match a transconductance of the second cascode amplifier.

In some aspects, the transformer is configured to invert polarity of current in a negative current path between the first cascode amplifier and the second cascode amplifier so that it adds constructively with current in a positive current path between the first cascode amplifier and the second cascode amplifier.

In some aspects, the techniques described herein relate to an apparatus, further including an inductor in a positive current path between the positive amplified output of the first cascode amplifier and the positive input of the second cascode amplifier, wherein an inductance of the inductor is substantially equal to (the same as a value of) a stray inductance of the transformer.

In some aspects, the techniques described herein relate to an apparatus, further including a peaking network coupled between the output node and the anode of the laser, the peaking network configured to further increase analog pre-emphasis of the output current provided to the laser.

In some aspects, the peaking network includes an inductor coupled between the output node and the anode of the laser.

In some aspects, the techniques described herein relate to an apparatus to interface a digital-to-analog converter to a vertical-cavity surface emitting laser, including: a first cascode amplifier having a first input and a second input, and a first output and a second output, the first input and the second input of the first cascode amplifier being coupled to receive positive and negative differential outputs, respectively, of the digital-to-analog converter, the first cascode amplifier configured to generate a first positive amplified current at the first output and a first negative amplified current at the second output; a second cascode amplifier having a first input and a second input, and a first output and a second output, the first input being of the second cascode amplifier being coupled to the first output of the first cascode amplifier, wherein the second cascode amplifier is configured to generate a second positive amplified current at the first output and to generate a second negative amplified current at the second output, wherein the first output and the second output of the second cascode amplifier are connected together at an output node and the second positive amplified current and the second negative amplified current are combined to produce an output current to be provided to an anode of the vertical-cavity surface emitting laser; a transformer having a primary winding that is coupled to the second output of the first cascode amplifier, a secondary winding coupled to the second input of the second cascode amplifier, and a center tap between the primary winding and the secondary winding; a capacitor coupled between the center tap and ground; and an operational transconductance amplifier having a first input coupled to the first output of the first cascode amplifier, a second input coupled to the secondary winding of the transformer, and an output coupled to the center tap of the transformer, wherein the operational transconductance amplifier is configured to generate an output current that is based on a difference between a voltage at the first input and a voltage at the second input so as to maintain a voltage at the center tap of the transformer; wherein the transformer is configured to invert, at higher frequencies, polarity of the first negative amplified current so that adds constructively with the first positive amplified current when amplified by the second cascode amplifier.

In some aspects, the transformer is configured to provide DC current from the first cascode amplifier to the second cascode amplifier to assist in biasing the second cascode amplifier.

In some aspects, the operational transconductance amplifier is configured to generate the output current to the center tap of the transformer based on a conversion factor so as to match a transconductance of the second cascode amplifier.

In some aspects, the techniques described herein relate to an apparatus, further including an inductor in a positive current path between the first output of the first cascode amplifier and the first input of the second cascode amplifier, wherein an inductance of the inductor is the same as a value of a stray inductance of the transformer.

In some aspects, the techniques described herein relate to an apparatus, further including a peaking network coupled between the output node and the anode of the vertical-cavity surface emitting laser, the peaking network configured to further increase analog pre-emphasis of the output current provided to the vertical-cavity surface emitting laser.

In some aspects, the techniques described herein relate to a method including: first amplifying, with a first cascode amplifier, positive and negative differential outputs of a digital-to-analog converter to provide a first positive amplified current and a first negative amplified current; second amplifying, with a second cascode amplifier, the first positive amplified current and the first negative amplified current generated by the first amplifying, to produce a second positive amplified current and a second negative amplified current; inverting, with a transformer, polarity of the first negative amplified current at higher frequencies so that the first negative amplified current adds constructively with the first positive amplified current when amplified by the second cascode amplifier; and combining the second positive amplified current and the second negative amplified current to produce an output current to be provided as input to a laser.

In some aspects, the techniques described herein relate to a method, further including providing DC current, via the transformer, from the first cascode amplifier to the second cascode amplifier to assist in biasing the second cascode amplifier.

In some aspects, the techniques described herein relate to a method, further including: maintaining a fixed voltage at a center tap of the transformer at DC and at higher frequencies.

In some aspects, the techniques described herein relate to a method, wherein maintaining is performed with an operational transconductance amplifier that is configured to supply a current to the center tap of the transformer based on a conversion factor to match a transconductance of the second cascode amplifier.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus to interface a digital-to-analog converter to a laser, comprising:
   a first cascode amplifier configured to receive as input positive and negative differential outputs of the digital-to-analog converter and to provide a positive amplified output and a negative amplified output;
   a second cascode amplifier having a positive input and a negative input, the positive input being coupled to the positive amplified output of the first cascode amplifier, wherein the second cascode amplifier is configured to generate a positive amplified current at a positive amplified output and to generate a negative amplified current at a negative amplified output, wherein the positive amplified output and the negative amplified output are connected together at an output node and the positive amplified current and the negative amplified current are combined to produce an output current that is provided as input to an anode of the laser; and
   a transformer coupled between the negative amplified output of the first cascode amplifier and the negative input of the second cascode amplifier.

2. The apparatus of claim 1, wherein the transformer is configured to invert polarity of current at higher frequencies in a negative current path between the first cascode amplifier and the second cascode amplifier.

3. The apparatus of claim 2, wherein the transformer is configured to provide DC current from the first cascode amplifier to the second cascode amplifier to assist in biasing the second cascode amplifier.

4. The apparatus of claim 1, wherein the transformer comprises a primary winding coupled to the negative amplified output of the first cascode amplifier, a secondary winding coupled to the negative input of the second cascode amplifier, and a center tap between the primary winding and the secondary winding.

5. The apparatus of claim 4, further comprising:
a capacitor coupled between the center tap of the transformer and ground; and
an operational transconductance amplifier having a first input coupled to the positive amplified output of the first cascode amplifier, a second input coupled to the secondary winding of the transformer, and an output coupled to the center tap of the transformer, wherein the operational transconductance amplifier is configured to generate an output current that is based on a difference between a voltage at the first input and a voltage at the second input so as to maintain a voltage at the center tap of the transformer.

6. The apparatus of claim 5, wherein the operational transconductance amplifier is configured to generate the output current to maintain the voltage at the center tap at lower frequencies, and the capacitor is configured to maintain the voltage at the center tap at higher frequencies.

7. The apparatus of claim 6, wherein the operational transconductance amplifier is configured to generate the output current to the center tap of the transformer based on a conversion factor so as to match a transconductance of the second cascode amplifier.

8. The apparatus of claim 7, wherein the transformer is configured to invert polarity of current in a negative current path between the first cascode amplifier and the second cascode amplifier so that it adds constructively with current in a positive current path between the first cascode amplifier and the second cascode amplifier.

9. The apparatus of claim 1, further comprising an inductor in a positive current path between the positive amplified output of the first cascode amplifier and the positive input of the second cascode amplifier, wherein an inductance of the inductor is substantially equal to a stray inductance of the transformer.

10. The apparatus of claim 1, further comprising a peaking network coupled between the output node and the anode of the laser, the peaking network configured to further increase analog pre-emphasis of the output current provided to the laser.

11. The apparatus of claim 10, wherein the peaking network comprises an inductor coupled between the output node and the anode of the laser.

12. An apparatus to interface a digital-to-analog converter to a vertical-cavity surface emitting laser, comprising:
a first cascode amplifier having a first input and a second input, and a first output and a second output, the first input and the second input of the first cascode amplifier being coupled to receive positive and negative differential outputs, respectively, of the digital-to-analog converter, the first cascode amplifier configured to generate a first positive amplified current at the first output and a first negative amplified current at the second output;
a second cascode amplifier having a first input and a second input, and a first output and a second output, the first input being of the second cascode amplifier being coupled to the first output of the first cascode amplifier, wherein the second cascode amplifier is configured to generate a second positive amplified current at the first output and to generate a second negative amplified current at the second output, wherein the first output and the second output of the second cascode amplifier are connected together at an output node and the second positive amplified current and the second negative amplified current are combined to produce an output current to be provided to an anode of the vertical-cavity surface emitting laser;
a transformer having a primary winding that is coupled to the second output of the first cascode amplifier, a secondary winding coupled to the second input of the second cascode amplifier, and a center tap between the primary winding and the secondary winding;
a capacitor coupled between the center tap and ground; and
an operational transconductance amplifier having a first input coupled to the first output of the first cascode amplifier, a second input coupled to the secondary winding of the transformer, and an output coupled to the center tap of the transformer, wherein the operational transconductance amplifier is configured to generate an output current that is based on a difference between a voltage at the first input and a voltage at the second input so as to maintain a voltage at the center tap of the transformer;
wherein the transformer is configured to invert, at higher frequencies, polarity of the first negative amplified current so that adds constructively with the first positive amplified current when amplified by the second cascode amplifier.

13. The apparatus of claim 12, wherein the transformer is configured to provide DC current from the first cascode amplifier to the second cascode amplifier to assist in biasing the second cascode amplifier.

14. The apparatus of claim 12, wherein the operational transconductance amplifier is configured to generate the output current to the center tap of the transformer based on a conversion factor so as to match a transconductance of the second cascode amplifier.

15. The apparatus of claim 12, further comprising an inductor in a positive current path between the first output of the first cascode amplifier and the first input of the second cascode amplifier, wherein an inductance of the inductor is substantially equal to a stray inductance of the transformer.

16. The apparatus of claim 12, further comprising a peaking network coupled between the output node and the anode of the vertical-cavity surface emitting laser, the peaking network configured to further increase analog pre-emphasis of the output current provided to the vertical-cavity surface emitting laser.

17. A method comprising:
first amplifying, with a first cascode amplifier, positive and negative differential outputs of a digital-to-analog converter to provide a first positive amplified current and a first negative amplified current;
second amplifying, with a second cascode amplifier, the first positive amplified current and the first negative amplified current generated by the first amplifying, to produce a second positive amplified current and a second negative amplified current;
inverting, with a transformer, polarity of the first negative amplified current at higher frequencies so that the first negative amplified current adds constructively with the first positive amplified current when amplified by the second cascode amplifier; and combining the second positive amplified current and the second negative amplified current to produce an output current to be provided as input to a laser.

18. The method of claim 17, further comprising providing DC current, via the transformer, from the first cascode amplifier to the second cascode amplifier to assist in biasing the second cascode amplifier.

19. The method of claim 17, further comprising:
maintaining a fixed voltage at a center tap of the transformer at DC and at higher frequencies.

20. The method of claim 19, wherein maintaining is performed with an operational transconductance amplifier that is configured to supply a current to the center tap of the transformer based on a conversion factor to match a transconductance of the second cascode amplifier.

* * * * *